United States Patent
Yang

(10) Patent No.: US 6,919,741 B2
(45) Date of Patent: Jul. 19, 2005

(54) CLOCK DOWN SENSOR

(75) Inventor: Chang Yi Yang, Taichung (TW)

(73) Assignee: Asia Optical Co., LTD, Tai Chung Hsien (TW)

( * ) Notice: Subject to any disclaimer, the term of this patent is extended or adjusted under 35 U.S.C. 154(b) by 27 days.

(21) Appl. No.: 10/717,581

(22) Filed: Nov. 21, 2003

(65) Prior Publication Data

US 2005/0052205 A1 Mar. 10, 2005

(30) Foreign Application Priority Data

Sep. 8, 2003 (TW) .......................... 92124797 A

(51) Int. Cl.⁷ ................................................ H03K 5/19
(52) U.S. Cl. ........................................ 327/20; 327/509
(58) Field of Search ............................ 327/20, 509–517

(56) References Cited

U.S. PATENT DOCUMENTS

| | | | | |
|---|---|---|---|---|
| 3,728,721 A | * | 4/1973 | Lee et al. .................. | 342/28 |
| 5,757,288 A | * | 5/1998 | Dixon et al. ............... | 340/941 |
| 6,124,798 A | * | 9/2000 | Tai et al. ................... | 340/685 |
| 6,222,668 B1 | * | 4/2001 | Dutrisac et al. .......... | 359/337 |
| 6,570,148 B2 | * | 5/2003 | Matsumoto et al. ...... | 250/221 |

FOREIGN PATENT DOCUMENTS

EP        0620647 A2  *  4/1994

* cited by examiner

*Primary Examiner*—Dinh T. Le
(74) *Attorney, Agent, or Firm*—Bacon & Thomas PLLC

(57) ABSTRACT

A clock down sensor mainly comprises a converter and a low-pass filter. The converter is used to convert an input signal from a PECL (Positive Emitter Coupling Logic) signal to a TTL (Transistor Transistor Logic) signal, the low pass filter is used to obtain a DC (Direct Current) level of the TTL signal. Thereby, the sensor can judge whether the clock signal is terminated according to the potential of the output signal in order to emit a warning so that a breakdown elimination inquiry can be done or automatic breakdown elimination can be processed earlier.

14 Claims, 5 Drawing Sheets

CLOCK DOWN SENSOR

BACKGROUND OF THE INVENTION

1. Field of the Invention

The present invention relates to a clock down sensor, and more particularly to a clock down sensor used to monitor the transmission status of network.

2. Description of Related Art

At present, there are many types of signal sensors and so are their usages; they can generally be used on fire warning, guarding against burglar and measurement. The basic principle of theirs is to use a temperature, pressure or light sensing equipment to detect the change of temperature, pressure and light, and then, a detecting signal is emitted to use as a warning signal. In general, clock pulse signal detection function does not exist in a general transmission facility, therefore, when a data transmission is processed in an optical fiber or a general wire material, if disappearance of a pulse signal happens in the middle of the transmission due to oscillator or other elements failure, no warning is received in the system even if a whole transmission is terminated. Thus, time and transmission resource wastes are caused because it is unable to be detected and repaired immediately. Therefore, the existence of a clock down sensor is necessary in a signal transmission.

SUMMARY OF THE INVENTION

The main object of the present invention is to provide an apparatus used to monitor whether clock pulse signals exist in a transmission media and to yield a detecting signal taken as a warning. Thereby, the phenomena of a transmission termination can be detected earlier, and the transmission can be recovered in time.

In view of the object mentioned above, a converter that can convert a signal to LVTTL (Low Voltage Transistor Transistor Logic) is used in the present invention to convert a clock pulse signal to a TTL signal, and after a DC (Direct Current) level of the TTL signal is obtained through a low-pass filter circuit, a high or a low potential of an output detecting signal is decided according to the DC level through an inverter. In this regard, the low-pass filter is used for rectification of a signal, thus any kind of rectifying device such as inductor can be used. The DC level signal is output as a zero (0) potential (hereinafter sometimes refers to "a low potential") and a detecting signal from the inverter is output as a positive potential (hereinafter sometimes refers to "a high potential") when the clock pulse signal is terminated or disappears. And vice versa, the DC level signal is output as a positive (+) potential (hereinafter sometimes refers to "a high potential") and a detecting signal from the inverter is output as a zero (0) potential (hereinafter sometimes refers to "a low potential") when the pulse signal exists. Thereby, the detecting signal will be sent to a microprocessor to generate a warning signal or to drive a self-repairing action. In this case, the inverter is used as a buffering device to buffer a ripple wave DC level signal resulting from R-C charging-discharging of the low pass filter and then invert the signal into a detecting signal opposite to the DC level signal. However, the inverter is not absolutely required because the DC level signal is able to be a detecting signal if the R-C (Resistance-Capacitor) time value of the low pass filter can match perfectly.

Therefore, there are many merits in the present invention. Detecting whether a pulse signal exists or not can allow an operator to realize the current state of the transmission facility, to find out the malfunction reason thereof and to repair it.

BRIEF DESCRIPTION OF THE DRAWINGS

The present invention can be more fully understood by reference to the following description and accompanying drawings, in which.

DETAILED DESCRIPTION OF THE PREFERRED EMBODIMENTS

Figure 1:
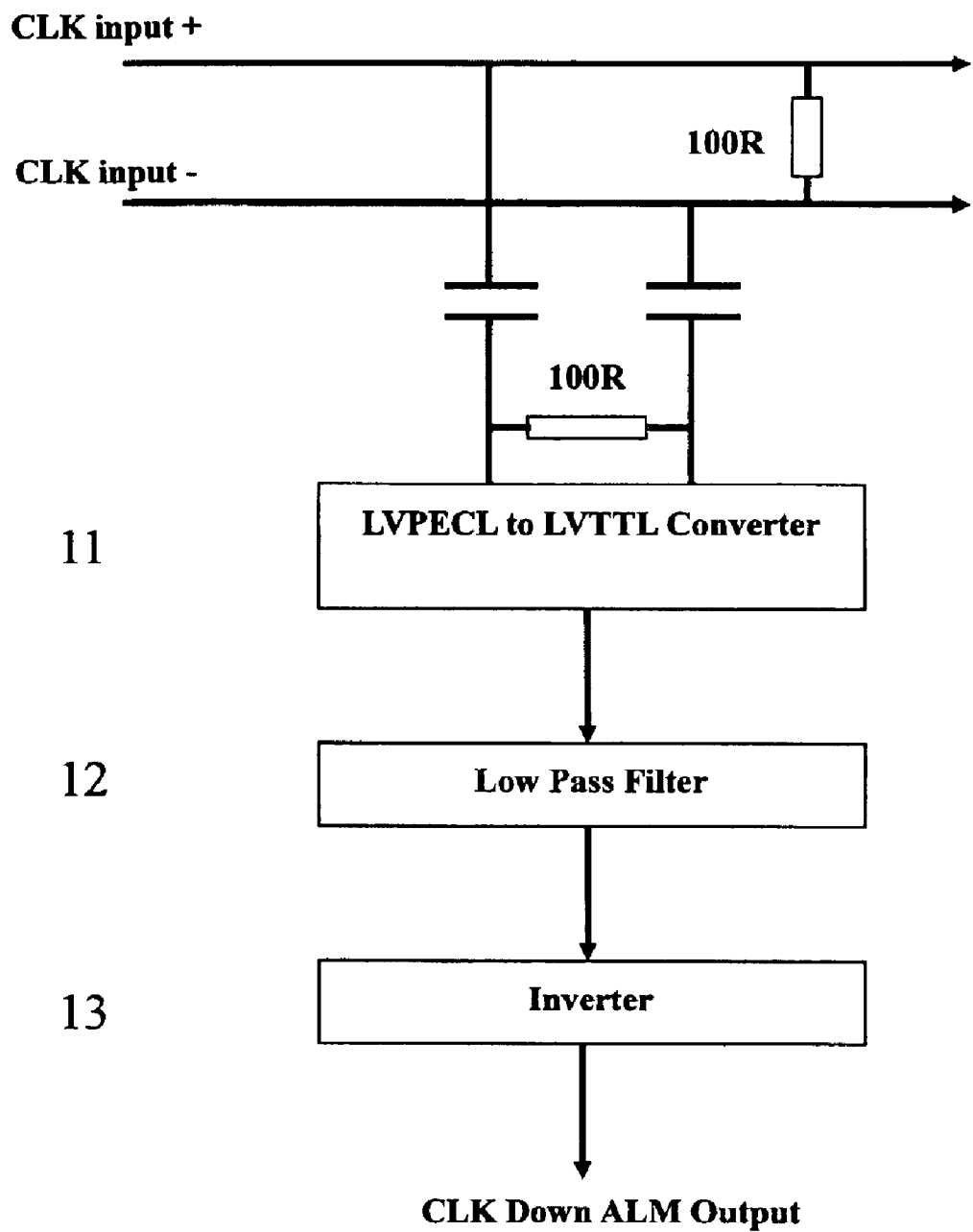
FIG. 1 is a block diagram showing a circuit of a clock down sensor according to one embodiment of the present invention.
Figure 2:
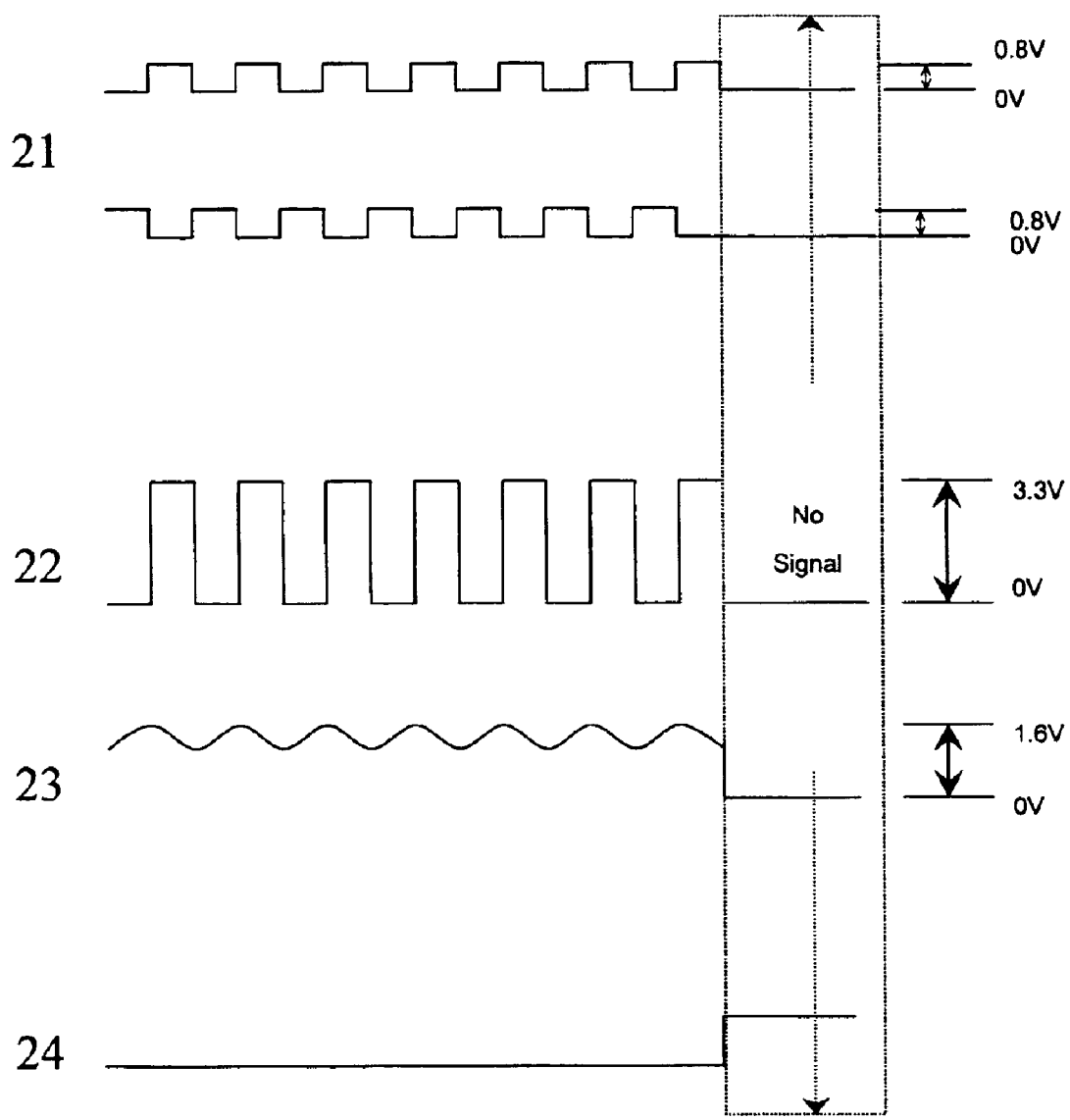
FIG. 2 is a graph showing a signal waveform corresponding to every circuit block generated from the clock down sensor shown in FIG. 1.

First, please refer to FIG. 1 and FIG. 2. FIG. 1 is a circuit block diagram showing a circuit of a clock down sensor according to one embodiment of the present invention, and FIG. 2 is a signal waveform diagram corresponding to every circuit block generated from the clock down sensor shown in FIG. 1.

According to the present invention, a positive and a negative clock pulse signals are first connected to a LVPECL (Low Voltage Positive Emitter Coupling Logic) to LVTTL (Low Voltage Transistor Transistor Logic) converter (11) through capacitors C1 (CLK input$^+$) and C2 (CLK input$^-$); the clock pulse signal is converted from an original positive and negative PECL square pulse signal of 0.8 V (21) to a TTL square pulse signal of 3.3V (22). Next, a signal with a DC level at an approximate potential 1.6V (23) is obtained through a low-pass filter (12). Finally, the DC level signal is inverted to a detecting signal (24) by way of an inverter (13).

How to obtain the detecting signal is shown as follows. The inverter (13) takes a transistor (as a numerical 33 shown in FIG. 3) therein as an electric switch. When the potential of the DC level signal is higher than 0.6V (cut-in potential), i.e. when the pulse signal is normal, the transistor is turned on, an output potential is zero at this time (i.e. a low potential); and when the potential of the DC level signal is lower than 0.6V, i.e. when the pulse signal disappears or is terminated, the transistor is at a cut-off state, an output potential is a positive potential (a high potential). Therefore, the potentials of the output detecting signal can be decided as a high or low potential according to the DC level signal, as (23) shown in FIG. 2; when the clock pulse signal is normal, the transistor is maintained at a turn-on state so as to allow the output potential of the detecting signal to be "0" because the potential of the DC level signal is maintained approximately at 1.6V which is higher than 0.6V, as (24) shown in FIG. 2,. However, when the pulse signal is terminated or disappears, the transistor is maintained at a cut-off state so as to keep the potential of the detecting signal continuously to be "a high potential" because the potential of the DC level signal is 0 V shown as the dotted line at the right side of (24) of FIG. 2).

Figure 3:
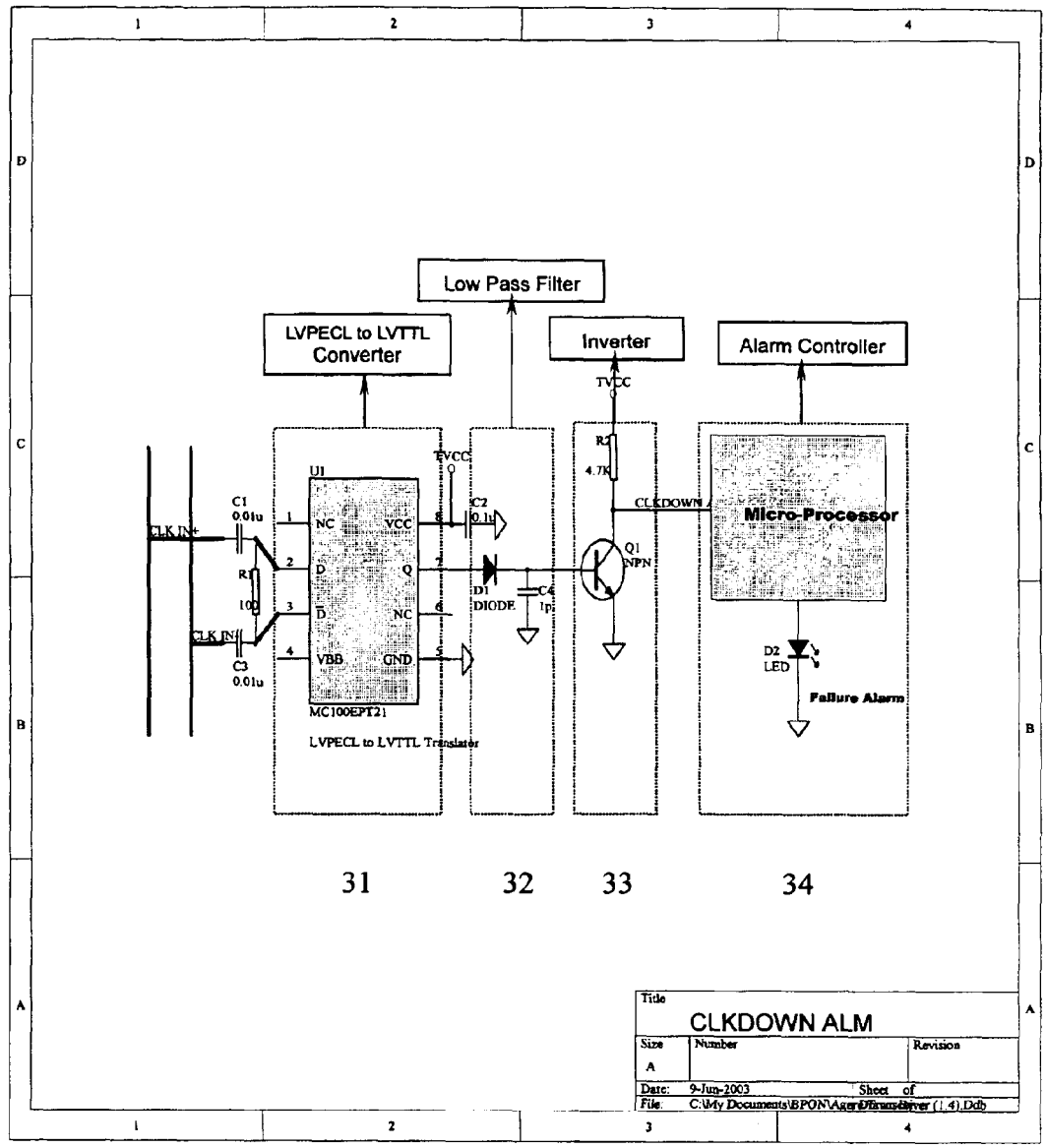
FIG. 3 is a diagram showing a circuit of a clock down sensor shown in FIG. 1.

Finally, please refer to FIG. 3. FIG. 3 shows a circuit of a clock down sensor of the embodiment according to the present invention as shown in FIG. 1. From the FIG. 3, it is shown that a clock down sensor comprises a converter (31), a low-pass filter (32), and an inverter (33). Here, an alarm controller (34) can further be connected after the inverter (33).

Figure 4:
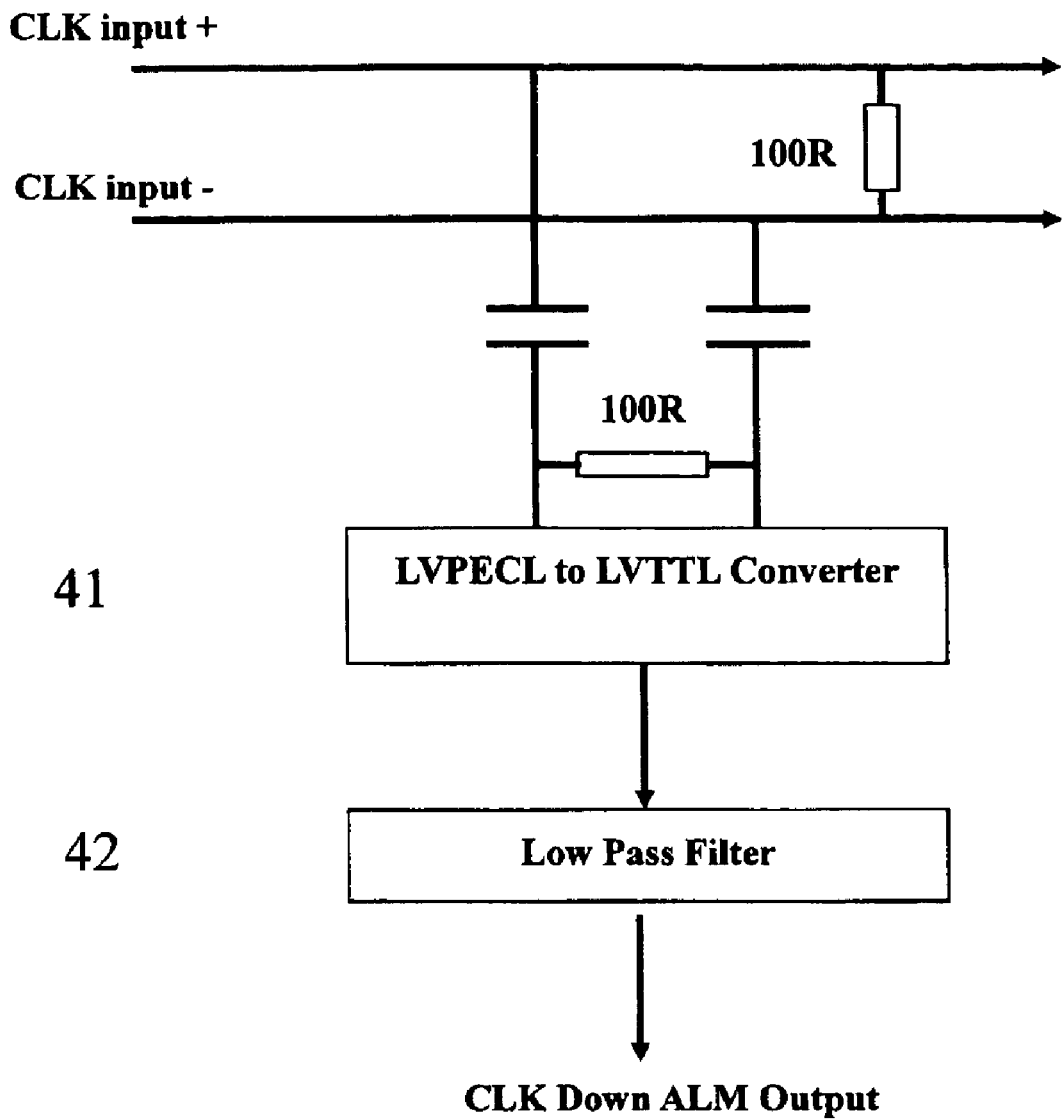
FIG. 4 is a block diagram showing a circuit of a clock down sensor according to another embodiment of the present invention, in which an inverter is not utilized.
Figure 5:
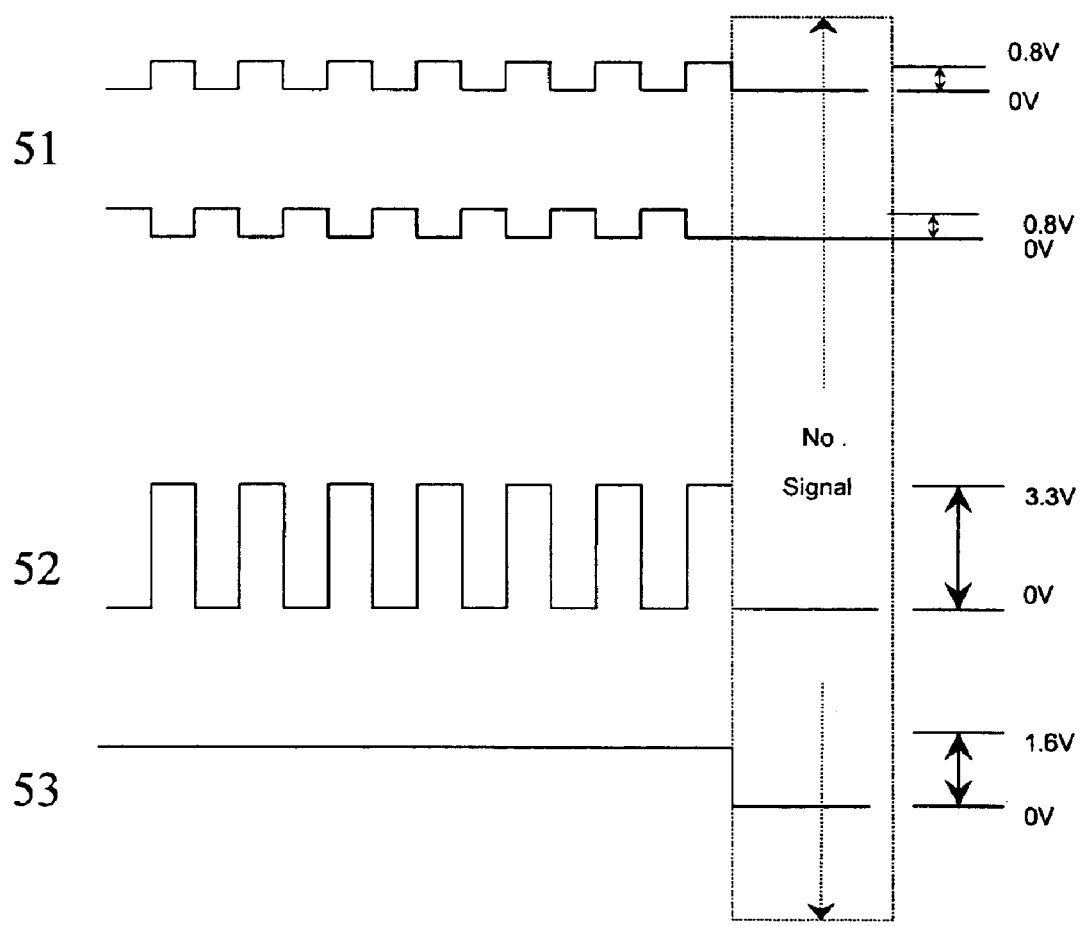
FIG. 5 is a graph showing a signal waveform corresponding to every circuit block generated from the clock down sensor shown in FIG. 4.

Then, please refer to FIG. 4 and FIG. 5 by reference to FIG. 2. FIG. 4 is a block diagram showing a circuit of a clock down sensor according to another embodiment of the present invention, in which an inverter is not utilized; and FIG. 5 is a graph showing a signal waveform corresponding to every circuit block generated from the clock down sensor shown in FIG. 4. In this embodiment, the inverter is not necessary since the DC level signal is a detecting signal due to the R-C (Resistance-Capacitor) time value of the low pass filter matching perfectly.

In FIG. 4 and FIG. 5, a positive and negative clock pulse signals are first connected to a LVPECL (Low Voltage Positive Emitter Coupling Logic) to LVTTL (Low Voltage Transistor Transistor Logic) converter (41) through capacitors C1 (CLK input$^+$) and C2 (CLK input); the clock pulse signal is converted from an original positive and negative PECL square pulse signal of 0.8 V (51) to a TTL square pulse signal of 3.3V (52). Next, a signal with a DC level at an approximate potential 1.6V (53) is obtained through a low-pass filter (42). When the pulse signal is terminated or disappears, the potential of the detecting signal continuously to be "a low potential", and vice versa, when the pulse signal exists, the potential of the detecting signal is to be "a high potential" so that the DC level signal 53 is directly sent to an alarm controller (34) for warning, as shown in FIG. 3 except omitting the inverter (33).

The converter (11), (31), (41) mentioned above is an IC circuit chip and can be used to convert a pulse signal with a LVPECL, LVCMOS, SSTL or HSTL form to a LVTTL signal. The converter that can be used in the embodiment is an LVPECL to LVTTL IC under a model number MC100EPT21.

The low pass filter (12), (32), (42) mainly comprised diodes and capacitors and is used to obtain a DC level signal.

The inverter (13) and (33) mainly comprises a transistor and is used to obtain a lever of "a high potential" or "a low potential" through the turn-on/cut-off characteristics.

The alarm controller (34) mainly comprises a microprocessor. When the detecting signal coming from the inverter arrives the alarm controller, it can be processed in the microprocessor. If the detecting signal is maintained at a low potential, i.e. a potential "0", the microprocessor needs not do any action, and continues to allow the input pulse signals to be transmitted fluently. But, if the detecting signal is maintained at a high potential, i.e. a positive potential, the microprocessor can control driving an illuminator or a beeper to issue a warning so as to meet the requirements of early troubleshooting or automatic troubleshooting processing.

It is noted that the clock down sensors described above are the preferred embodiments of the present invention for the purpose of illustration only, and are not intended as a definition of the limits and scope of the invention disclosed. Any modifications and variations that may be apparent to a person skilled in the art are intended to be included within the scope of the present invention.

What is claimed is:

1. A sensor for detecting a clock signal transmitting in a transmission system, comprising:

a converter for converting the clock signal to a TTL (Transistor Transistor Logic) signal; and
   a low-pass filter for transforming the TTL signal into a DC signal, in which the DC signal being a detecting signal;
   whereby, when the clock signal is shut down, the low-pass filter outputs a detecting signal with low potential DC level; when the clock signal is normal, the low-pass filter outputs a detecting signal with high potential DC level.

2. The sensor according to claim 1, wherein said clock signal is converted to said converter via a capacitor.

3. The sensor according to claim 1, wherein said high potential is a positive potential and said low potential is a zero potential.

4. The sensor according to claim 1, wherein said converter is a LVPECL (Low Voltage Positive Emitter Coupling Logic), a LVCMOS (Low Voltage Complementary Metal Oxidization Semiconductor), a SSTL (Stub Series Terminated Logic) or a HSTL (High Speed Transmitter Logic) to LVTTL (Low Voltage Transistor Transistor Logic) converter.

5. The sensor according to claim 1, wherein said low-pass filter is composed of diodes and capacitors.

6. The sensor according to claim 1, wherein said detecting signal can drive an illuminator or a sound device through a microprocessor to emit a warning signal.

7. A sensor for detecting a clock signal transmitting in a transmission system, comprising:

a converter for converting the clock signal to a TTL (Transistor Transistor Logic) signal;
   a low-pass filter for transforming the TTL signal into a DC signal; and
   an inverter for transforming said the level of the DC signal into a detecting signal;
   whereby, when the clock signal is shut down, the inverter outputs a detecting signal with high potential; when the clock signal is normal, the inverter outputs a detecting signal with low potential.

8. The sensor according to claim 7, wherein said high potential is a positive potential and said low potential is a zero potential.

9. The sensor according to claim 7, wherein said clock signal is converted to said converter via a capacitor.

10. The sensor according to claim 7, wherein said converter is a LVPECL (Low Voltage Positive Emitter Coupling Logic), a LVCMOS (Low Voltage Complementary Metal Oxidization Semiconductor), a SSTL (Stub Series Terminated Logic) or a HSTL (High Speed Transmitter Logic) to LVTTL (Low Voltage Transistor Transistor Logic) converter.

11. The sensor according to claim 7, wherein said low-pass filter is composed of diodes and capacitors.

12. The sensor according to claim 7, wherein said inverter comprises a transistor circuit which defines a cut-in potential; when a potential of said pulse signal is lower than said cut-in potential, said transistor is maintained at a cut-off state, and outputs a detecting signal with a positive potential; when a potential of said pulse signal is higher than said cut-in potential, said transistor is maintained at a cut-in state, and outputs a detecting signal with a zero potential.

13. The sensor according to claim 7, wherein said cut-in potential of said transistor is 0.6V.

14. The sensor according to claim 7, wherein said detecting signal can drive an illuminator or a sound device through a microprocessor to emit a warning signal.

* * * * *